United States Patent
Kang

[11] Patent Number: 6,078,493
[45] Date of Patent: Jun. 20, 2000

[54] FIN-SHAPED CAPACITOR

[75] Inventor: Chang-seok Kang, Suwon, Rep. of Korea

[73] Assignee: Samsung Electronics Co., Ltd., Suwon, Rep. of Korea

[21] Appl. No.: 09/083,886

[22] Filed: May 26, 1998

Related U.S. Application Data

[62] Division of application No. 08/550,326, Oct. 30, 1995, Pat. No. 5,834,357.

[30] Foreign Application Priority Data

Dec. 15, 1994 [KR] Rep. of Korea ............... 94-34499

[51] Int. Cl.[7] .................... H01G 4/005; H01L 21/20
[52] U.S. Cl. .................... 361/303; 361/305; 361/311; 257/308; 257/310; 438/396; 438/240; 438/253
[58] Field of Search .................... 361/301.4, 303, 361/305, 311–313, 322, 329–330; 257/295–296, 300, 303, 306, 307, 308–309, 310, 516, 532; 438/243, 244, 396, 397, 399, 240, 253, 254, 919

[56] References Cited

U.S. PATENT DOCUMENTS

| | | | |
|---|---|---|---|
| 4,700,457 | 10/1987 | Matsukawa | 438/396 |
| 5,168,073 | 12/1992 | Gonzalez et al. | 438/397 |
| 5,192,703 | 3/1993 | Lee et al. | 438/396 |
| 5,416,037 | 5/1995 | Sato et al. | 438/254 |
| 5,532,182 | 7/1996 | Woo | 438/254 |
| 5,573,967 | 11/1996 | Tseng | 438/254 |
| 5,656,536 | 8/1997 | Wu | 438/397 |

*Primary Examiner*—Kristine Kincaid
*Assistant Examiner*—Anthony Dinkins
*Attorney, Agent, or Firm*—Jones Volentine, L.L.P.

[57] ABSTRACT

A capacitor includes a first electrode in which a first material layer composed of a conductive oxide and a second material layer formed of a conductive material are alternately stacked. The side surface of the second material layer is recessed to form a fin-shaped structure and the second material layer is etched to have a width shorter than that of the first material layer. The capacitor also includes a second electrode and a dielectric material formed between the first electrode and the second electrode.

10 Claims, 10 Drawing Sheets

FIN-SHAPED CAPACITOR

CROSS REFERENCE TO RELATED APPLICATIONS

This is a divisional application of application Ser. No. 08/550,326, filed Oct. 30, 1995 now U.S. Pat. No. 5,834,357.

BACKGROUND OF THE INVENTION

The present invention relates to a method of fabricating a capacitor of a semiconductor device, and more particularly, to a method of fabricating a fin-shaped capacitor having a fin-shaped electrode and a high dielectric layer.

With the increase of integration of a dynamic random access memory (DRAM) device, a number of methods have been proposed to increase a capacitance within a limited cell area. Generally, these methods are classified into the following three methods: (1) making a dielectric layer thinner, (2) increasing an effective area of the capacitor, and (3) using a material for the dielectric layer having a high dielectric constant.

The first method has the drawback that it cannot be applied to a memory device of very large capacity. Since reliability is lowered by a Fowler-Nordheim current when the thickness of a dielectric layer is thinned to below 100 Å, the first method is limited to memory devices whose dielectric layer has a thickness greater than 100 Å. Thus, any large capacity memory device requiring a dielectric layer thinner than 100 Å can not be constructed using the first method.

Accordingly, the second method has been proposed using capacitors having three dimensional structures such as a cylinder shape or a fin shape. These shapes serve to increase the effective area of the capacitor, without reducing the thickness of the dielectric layer below its minimum thickness.

In addition, new materials for the dielectric layer have been proposed having high dielectric constants. This also raises the capacitance of a capacitor without requiring that the thickness of the dielectric layer be reduced to a fatally low level. Materials currently used as dielectric layers include a ferroelectric material of a perovskite structure, for example, BZT ($PbZrTiO_2$) or BST ($BaSrTiO_3$), and another materials having high dielectric constants, such as tantalum pentoxide ($Ta_2O_5$).

The ferroelectric material has a spontaneous polarization which is different from a conventional oxide layer and the dielectric constant of the ferroelectric material ranges from about several hundreds up to one thousand. When using such a ferroelectric material as a dielectric layer, it is possible to realize a thin equivalent oxide thickness of less than 10 Å by using the ferroelectric material layer having thickness of several hundreds of angstroms. Tantalum pentoxide has a dielectric constant three times the that of a silicon oxide or silicon nitride and has been widely researched as a desirable dielectric layer for a high integration DRAM.

In order to use the PZT or the BST as the dielectric layer, the material constituting the electrode of the capacitor must satisfy the following conditions. First, since a high temperature, above 800° C., is needed for the dielectric layer to form on a surface of an electrode as a perovskite structure, the electrode material must be stable at high temperatures. Second, a layer having a low dielectric constant should not be generated on an interface between the electrode and the ferroelectric. Third, the mutual diffusion of atoms constituting silicon or ferroelectric should be prevented. Fourth, a patterning of the electrode should be easily accomplished.

Currently, platinum (Pt) is most frequently used as the electrode material for a capacitor using a ferroelectric material such as PZT or BST in its dielectric layer. Platinum satisfies the first, second, and third conditions, but does not satisfy the fourth condition. Generally, it is difficult to etch a noble metal such as platinum so that the patterning of a platinum electrode is not easy. Therefore, a material containing ruthenium (Ru) has been proposed as the electrode of a capacitor using PZT or BST as its dielectric material. This is shown, for example, in U.S. Pat. No. 5,185,689. However, since the prior art electrode is of plate shape, a problem arises in that the effective area of the capacitor is limited to the area of the plate.

Figure 1:
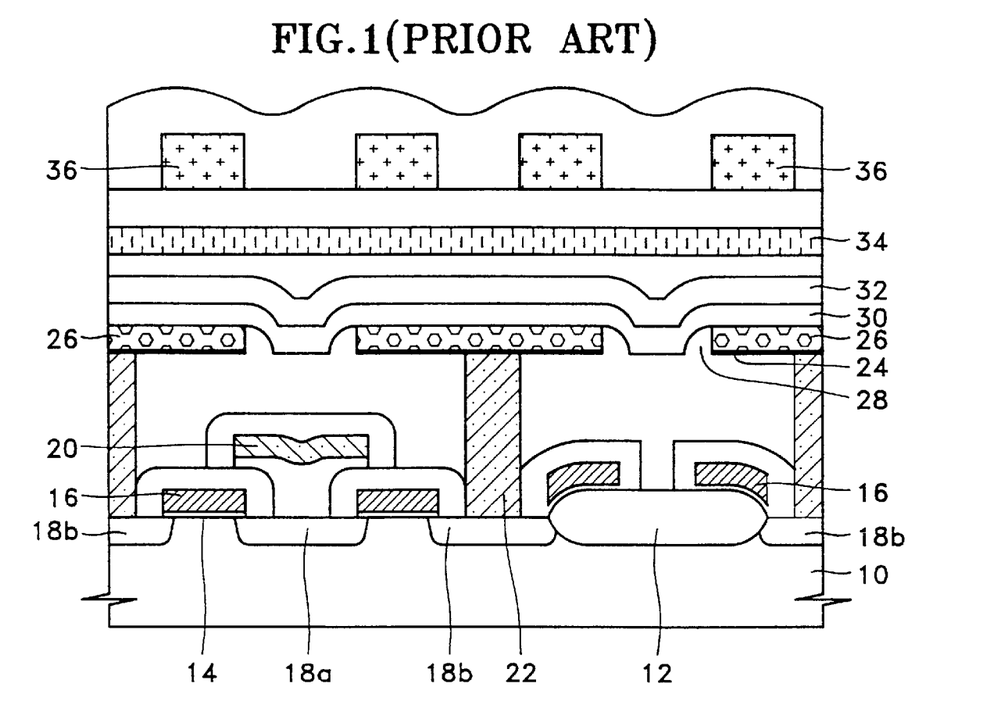
FIG. 1 is a cross-sectional view of a semiconductor memory device having a ferroelectric capacitor manufactured by a conventional method.

FIG. 1 is a cross-sectional view of a memory cell having a ferroelectric capacitor manufactured according to the above conventional method. Referring to FIG. 1, a transistor is formed on a substrate 10 by first providing a gate oxide layer 14 and a gate electrode 16 above the gate oxide layer 14. A drain region 18a and a source region 18b are then created on the substrate on either side of the gate electrode 16, and a lower bit line 20 is formed above the drain region 18a. A field oxide layer 12, defining an active region, is then formed on the substrate 10 and an insulating layer 23 is formed on the whole surface of the resultant structure.

Next, a contact hole for exposing source region 18b is formed in the insulating layer 23 and the inside of the contact hole is filled with a conductive material to form a conductive plug 22. Then, a diffusion barrier 24 and a lower electrode 26 of the capacitor, composed of platinum (Pt), are sequentially formed on the resultant structure and an oxide spacer 28 is formed on the side walls of the lower electrode 26. A ferroelectric layer 30 composed of BST, an upper electrode 32 of the capacitor, an upper bit line 34, and an Al wiring 36 are then formed sequentially above the lower electrode 26.

When forming a storage node according to the above conventional method the potential increase in the area of the capacitor is limited since only the flat surface of the storage electrode can be used. Since the material used as the lower electrode 26 in the conventional ferroelectric capacitor cannot be easily patterned, a more complicated structure such as a fin shape cannot be formed to increase the effective area of the capacitor.

An additional problem arises if tantalum pentoxide is used in the fabrication of the capacitor. When using tantalum pentoxide, the characteristics of the capacitor deteriorate because of a BPSG flow after the capacitor is formed.

A poly-Si/TiN/$Ta_2O_5$/poly-Si structure has been proposed as the electrode structure for preventing the deterioration of the capacitor consisting of the tantalum pentoxide in Kwon ki-won et al., "Degradation-Free $Ta_2O_5$ Capacitor after BPSG Reflow at 850° C. for High Density DRAMs" (IEDM 1993). However, since a sputtered TiN is used as an upper electrode in this case, the step coverage of TiN deteriorates if the storage node becomes complicated. Thus, the lower electrode of a complicated structure cannot be adopted in the conventional tantalum pentoxide capacitor.

SUMMARY OF THE INVENTION

It is an object of the present invention to provide a fin-shaped capacitor having an increased capacitance wherein the electrode of a capacitor used together with a ferroelectric material is formed in fin shape.

It is another object of the present invention to provide a method of fabricating a fin-shaped capacitor having increased capacitance.

It is a still another object of the present invention to provide a fin-shaped capacitor having the increased capacitance by patterning a metal electrode capable of being used together with a high dielectric material.

It is yet another object of the invention to provide a fabrication method for a fin-shaped capacitor having increased capacitance.

To accomplish the above objects, there is provided a capacitor including a first electrode formed as a fin-shaped structure including one or more first material layers alternately stacked over one or more second material layers; a second electrode; and a dielectric material formed between the first electrode and the second electrode, wherein the one or more first material layers comprise a conductive oxide, the one or more second material layers comprise a conductive substance, and the one or more second material layers are etched to have a width shorter than that of the one or more first material layers.

The one or more first material layers of the first electrode can comprise of ruthenium oxide, indium tin oxide, osmium oxide, or iridium oxide. The one or more second material layers of the first electrode can comprise of Pt, Pd, Ir, Ru, Os, Al, Ti, or Ta.

It is preferable that the exposed surface of the one or more second material layers be covered with the oxide of the material composing the second material layer. It is also preferable that the thickness of the oxide covering the exposed portion of the one or more second material layers be approximately 50–200 Å.

It is preferable that the dielectric material is selected from a group consisting of PZT(Pb(Zr,Ti)$O_3$), PLZT((Pb,La)(Zr,Ti)$O_3$), lead zirconate, BST(BaSrTi$O_3$), STO(SrTi$O_3$), tantalum pentoxide, silicon oxide, ONO(oxide-nitride-oxide), titanium silicate, $Bi_3Ti_4O_{12}$, silicon nitride, titanium oxide, lead titanate, and $SrBi_2Ta_2O_9$. Among these material, PZT (Pb(Zr,Ti)$O_3$), PLZT((Pb,La)(Zr,Ti)$O_3$) and BST (BaSrTi$O_3$) are ferroelectric materials having a perovskite structure. The second electrode may comprise a material selected from a group consisting of Ru, Pt, Ti, and Ir.

The capacitor is preferably connected to the electrode of a transistor to thereby constitute a DRAM cell or a nonvolatile memory cell. Also, the capacitor may further include a conductive plug electrically connecting the first electrode to a source region on a semiconductor substrate and a diffusion barrier formed between the first electrode and the conductive plug.

The method of fabricating a fin-shaped capacitor according to the present invention includes the steps of alternately stacking one or more first material layers comprising a conductive oxide and one or more second material layers comprising a conductive substance, selectively etching the one or more first material layers and the one or more second material layers to form a fin shaped first electrode, forming a dielectric material on the first electrode, and forming a second electrode on the dielectric material.

The method of fabricating the capacitor can further includes a step of oxidizing the exposed surface of the second material layer of the fin-shaped first electrode. At this time, it is preferable that the thickness of an oxide layer formed on the exposed surface of the second material layer be approximately 50–200 Å.

The one or more first material layers of the first electrode can comprise ruthenium oxide, indium tin oxide, osmium oxide, or iridium oxide. The one or more second material layers of the first electrode can comprise Pt, Pd, Ir, Ru, Os, Al, Ti, or Ta. The second electrode can be formed to comprise a material selected from the group consisting of Ru, Pt, Ti, and Ir.

The method of fabricating the capacitor further includes the steps of forming a conductive plug electrically connecting the first electrode to the source region on the semiconductor substrate and forming the diffusion barrier between the first electrode and the conductive plug.

According to one embodiment of the present invention, the one or more first material layers are formed of a metal oxide and the one or more second material layers are formed of a metal and the one or more first material layers and the one or more second material layers are stacked by a sputtering process. The sputtering process is preferably carried out by repeating at least one time the steps of depositing only the metal and depositing only the metal oxide, both depositing steps being carried out by using a sputtering device to which a first target comprised of the metal and a second target comprised of the metal oxide are mounted, respectively.

According to another embodiment of the present invention, the sputtering process may be carried out by repeating at least one time the steps of forming a metal oxide layer by sputtering in an atmosphere comprising a mixture of oxygen and an inert gas, discharging the oxygen from a sputtering chamber, and forming a metal layer by sputtering in an atmosphere of only the inert gas, both forming steps being carried out using a sputtering device to which only a target composed of the metal is mounted. Here, it is preferable that the metal is Ru or Ir and the metal oxide is $RuO_2$ or $IrO_2$.

According to still another embodiment of the present invention, the first material layer and the second material layer are stacked by a chemical vapor deposition (CVD) method. The CVD method may be carried out by the separate steps of forming the first material layer and of forming the second material layer, respectively.

According to yet another embodiment of the present invention, a capacitor is provided wherein the second electrode includes the poly-silicon and the dielectric material includes the tantalum pentoxide.

According to the present invention as described above, even in the capacitor comprising the ferroelectric, the fin-shaped structure increases the capacitance. Furthermore, when the poly-silicon is used for the lower electrode, the oxide layer, which is a lower dielectric layer, is formed on the interface between $Ta_2O_5$ and the poly-silicon to reduce the dielectric capacity of the capacitor. According to the present invention, if a conductive oxide electrode is used, the reduction of the dielectric capacity can be avoided so that the capacitance of only $Ta_2O_5$ can be obtained.

BRIEF DESCRIPTION OF THE DRAWINGS

The above objects and advantages of the present invention will become more apparent by describing in detail a preferred embodiment thereof with reference to the attached drawings in which.

DESCRIPTION OF PREFERRED EMBODIMENTS

Referring to the attached drawings, preferred embodiments of the present invention are explained below.

First Preferred Embodiment

Figure 2:
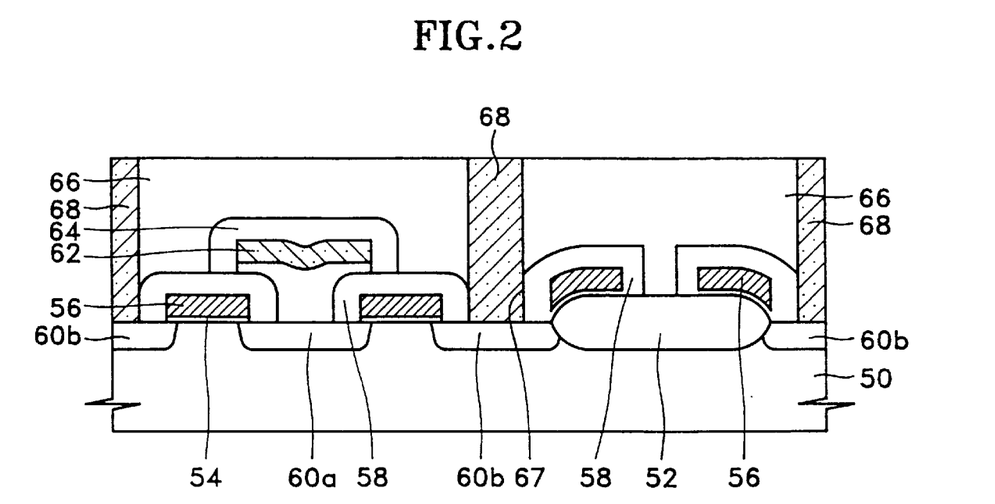
FIGS. 2 to 8 are cross-sectional views for explaining a process of fabricating a capacitor according to a preferred embodiment of the present invention.

A first preferred embodiment of the present invention is shown in FIGS. 2–8, which are cross-sectional views of a process for forming a capacitor. FIG. 2 shows a step of forming a contact hole 67 and a conductive plug 68 on a semiconductor substrate 50. A gate oxide layer 54 and a gate electrode 56 are formed on semiconductor substrate 50 in which an active region is defined by a field oxide layer 52. Next, impurity ions are injected using gate electrode 56 as an ion injection mask. This forms a drain region 60a and a source region 60b on the substrate 50. Next, a first insulating layer 58 is formed on the resultant structure and is anisotropically etched to expose drain region 60a. A bit line 62, capped by a second insulating layer 64, is then formed on drain region 60a. Next, in order to flatten the substrate surface, a planarization layer 66 is formed on the whole surface of substrate 50. Then, planarization layer 66 and first insulating layer 58, stacked on source region 60b, are etched by a photo-lithography to form a contact hole 67 for connecting the lower electrode of the capacitor to source region 60b. A conductive material, for example, poly-silicon doped with impurities, is deposited on substrate 50 having contact hole 67. The conductive material is then etched-back to fill the inside of contact hole 67 with a conductive plug 68.

Figure 3:
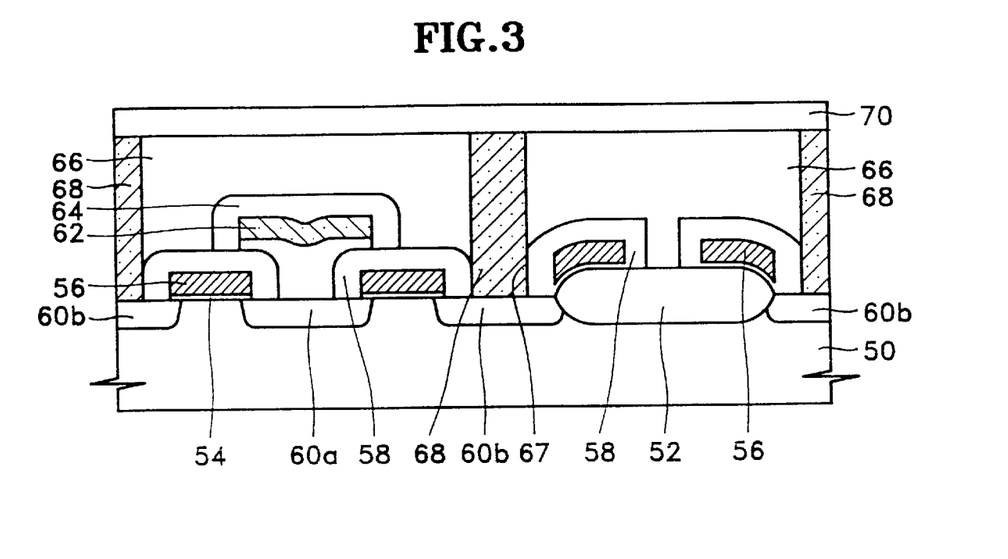

Referring to FIG. 3, a TiN layer 70 is formed with a thickness of several tens of angstroms up to 300 Å. The TiN layer 70 acts as a diffusion barrier between conductive plug 68 and a lower electrode which will be formed later.

Figure 4:
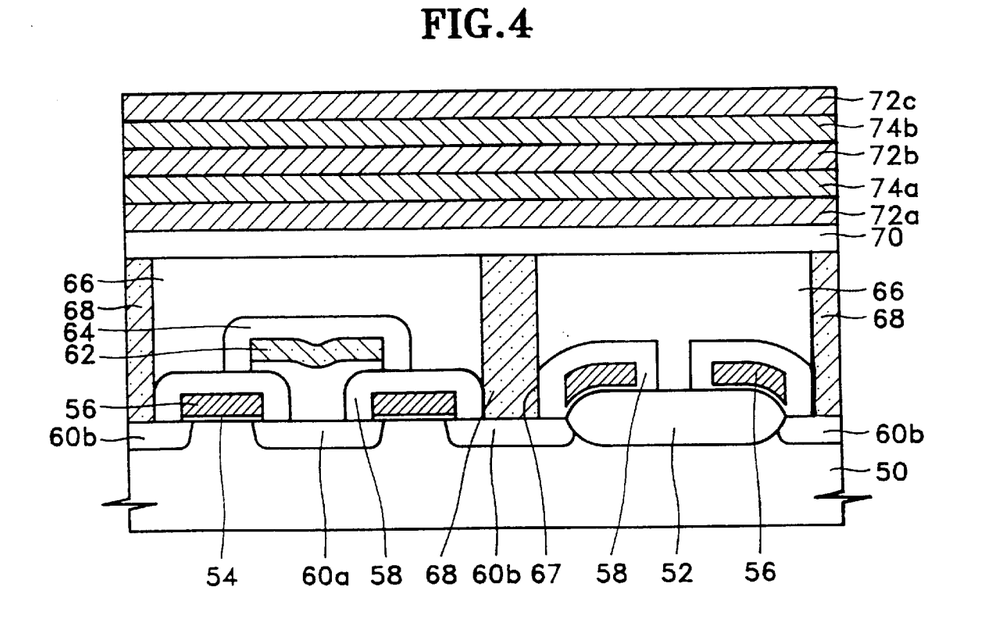

Referring to FIG. 4, $RuO_2$ layers 72a, 72b, and 72c and Ru layers 74a and 74b are repeatedly deposited on the diffusion barrier. Preferably, the first and the last layers deposited on the diffusion barrier are $RuO_2$ layers.

The Ru layers and the $RuO_2$ layers are stacked by using DC or RF sputtering method or CVD method under an argon (Ar) atmosphere. The respective thicknesses of the stacked layers is preferably 100–1000 Å. The thickness of the lower electrode is preferably 3000 Å. It is also preferable that the thickness of each of three $RuO_2$ layers be approximately 500 Å and the thickness of each of two Ru layers be approximately 750 Å. However, the thickness and the number of the stacked layers can be adjusted according to the desired dielectric capacity.

Figure 5:
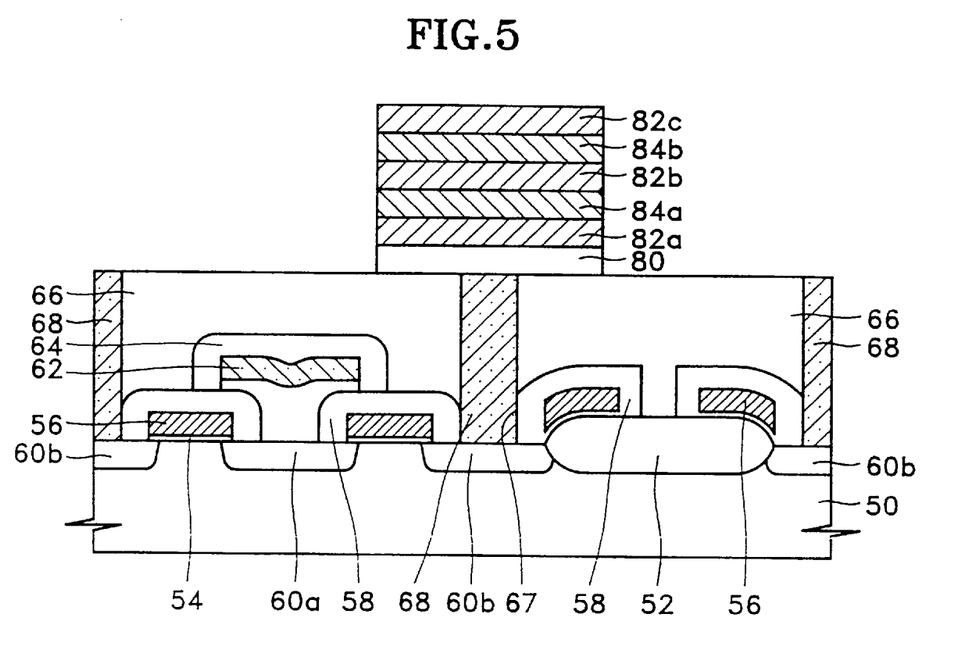

Referring to FIG. 5, the stacked $RuO_2$ layers 72a, 72b, and 72c, Ru layers 74a and 74b, and TiN layer 70 undergo photolithography to form a pattern of the lower electrode. The resulting TiN layer 80, $RuO_2$ layers 82a, 82b, and 82c, and Ru layers 84a and 84b are stacked in turns above conductive plug 68 as a result of the patterning. At this time, the stacked layer is patterned by a reactive ion etching (RIE) method using a HBr mixed gas.

Figure 6:
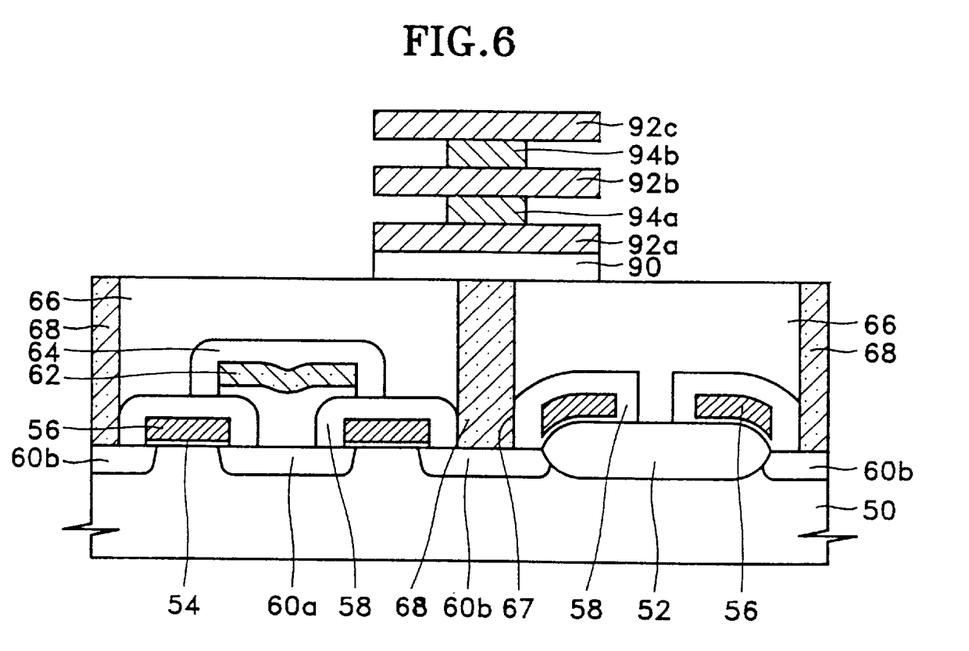

Referring to FIG. 6, only Ru layers 84a and 84b of the lower electrode are selectively etched by using an aqua regia or an aqueous solution of 5%NaOCl+3%NaOH. Since the etching solution dissolves Ru layers 84a and 84b, but does not dissolve $RuO_2$ layers 82a, 82b and 82c, it is possible to etch these layers selectively. Thus, the etching results in etched Ru layers 94a and 94b, but not etched $RuO_2$ layers 82a, 82b, and 82c. Either dry etching or wet etching can be used to perform this etching step. An etching time is adjusted according to an etching speed of Ru to thereby adjust the depth resulting from etching Ru layers 94a and 94b.

A step or a recessed portion formed by etching only Ru layers 94a and 94b results from the selective etching. This step portion contributes to increase the effective area of the lower electrode.

Although Ru and $RuO_2$ layers are used in the above embodiment, the effect obtained by the above etching can be realized using Ir and $IrO_2$ layers as well.

Figure 7:
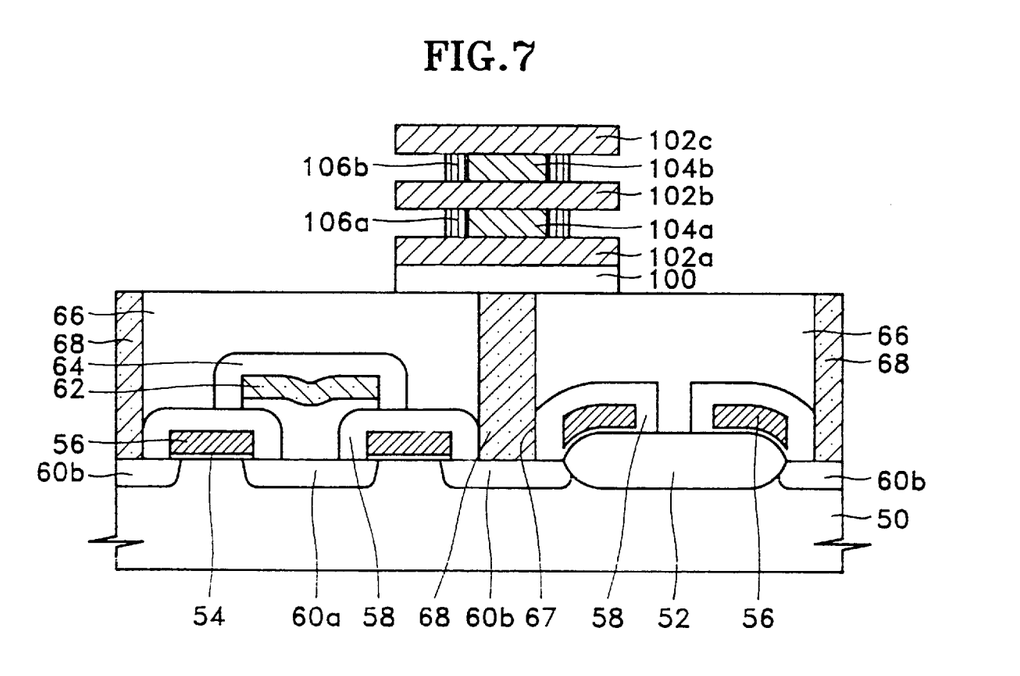

Referring to FIG. 7, a heat treatment is performed in this embodiment under an oxygen atmosphere so that the surfaces of the etched Ru layers 94a and 94b are oxidized to become $RuO_2$. This results in each of etched Ru layers 94a and 94b becoming a Ru core 104a and 104b with a $RuO_2$ layer 106a and 106b on either side. Preferably, the thicknesses of $RuO_2$ layers 106a and 106b are each approximately 100 Å.

As result of this thermal oxidization, the lower electrode is wholly covered with $RuO_2$. Ru and $RuO_2$ have an electrical conductivity enough to be used as the lower electrode.

Figure 8:
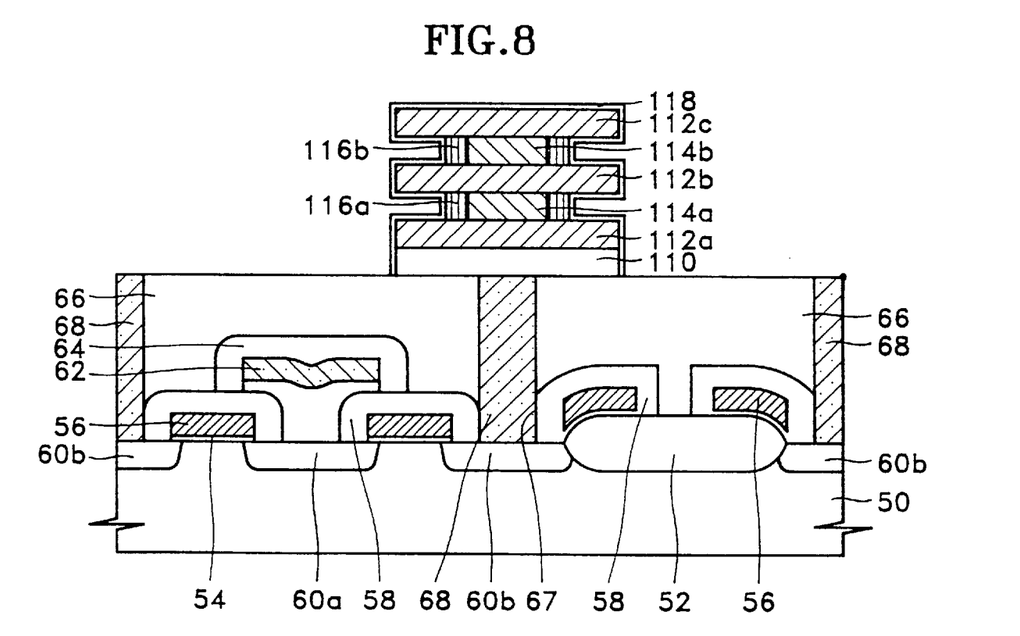

Referring to FIG. 8, a dielectric material, preferably BST or PZT, is then deposited on the surface of the lower electrode to form a dielectric film 118 of the capacitor. As the method of depositing dielectric film, a CVD method having a good step coverage, a sol-gel method, or a LSCVD method are preferably used.

Next, an upper electrode (not shown) is formed. Since there are steps on the surface of the lower electrode, a conductive metal or a precious metal can be deposited by the CVD method to have a good step coverage.

Figure 9A:
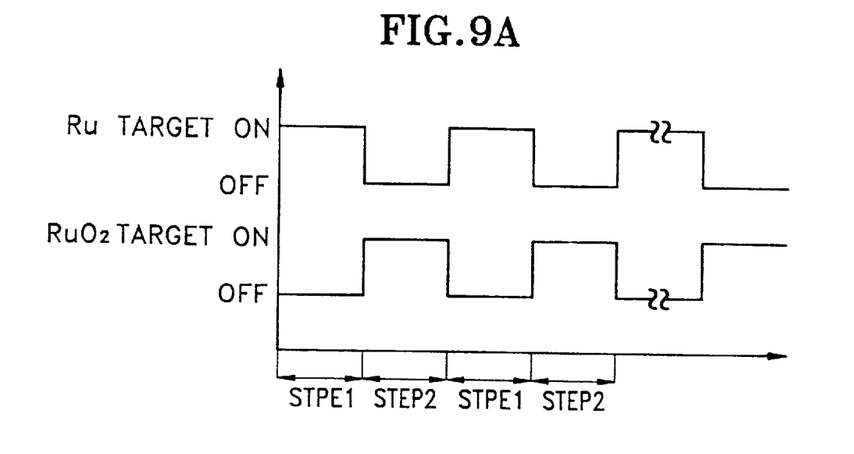
FIGS. 9A to 9C are graphs for explaining methods of forming a lower electrode of the capacitor according to a preferred embodiment of the present invention.
Figure 9B:
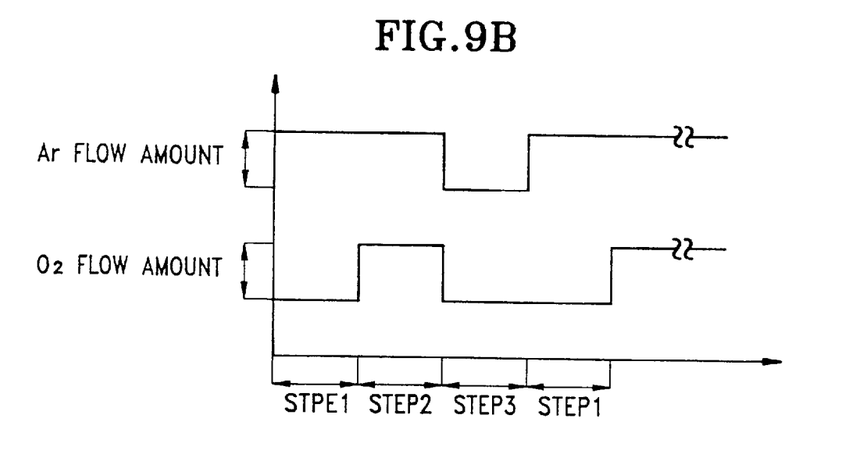

FIGS. 9A and 9B show the methods of stacking metal oxide layers and metal layers to form the lower electrode of the capacitor. FIG. 9A shows the method of forming stacked $Ru/RuO_2$ layers by using a sputtering device having two-source target mounted with $RuO_2$ and Ru simultaneously. In this sputtering method, a first step of sputtering only a Ru target and a second step of sputtering only $RuO_2$ are distinctively executed and the first and second steps are repeated as many times as necessary to obtain the desired layer number of $Ru/RuO_2$ layers. As conditions for sputtering, it is preferable to have an atmosphere of an inert gas such as Ar or $N_2$, a chamber pressure of 1–100 mTorr, and a substrate temperature ranging from room temperature to 500° C.

FIG. 9B shows another method of forming stacked $Ru/RuO_2$ layers by using the sputtering device mounted with only a Ru target. This sputtering is also repeated as many times as necessary to obtain the desired layer number of Ru/RuO$_2$ layers in the chamber. As with the previous method, the sputtering is preferably performed with a pressure of 1–100 mTorr and at a substrate temperature ranging from room temperature to 500° C. This sputtering method distinctively executes a first step of flowing an inert gas such as Ar or N$_2$, a second step of flowing oxygen in an amount of 1–50% of a whole discharge gas to the inert gas to sputter under the oxidative atmosphere, and a third step of discharging the gas inside the chamber so that the pressure of the chamber is not more than 1 mTorr to thereby remove the oxygen inside the chamber.

Figure 9C:
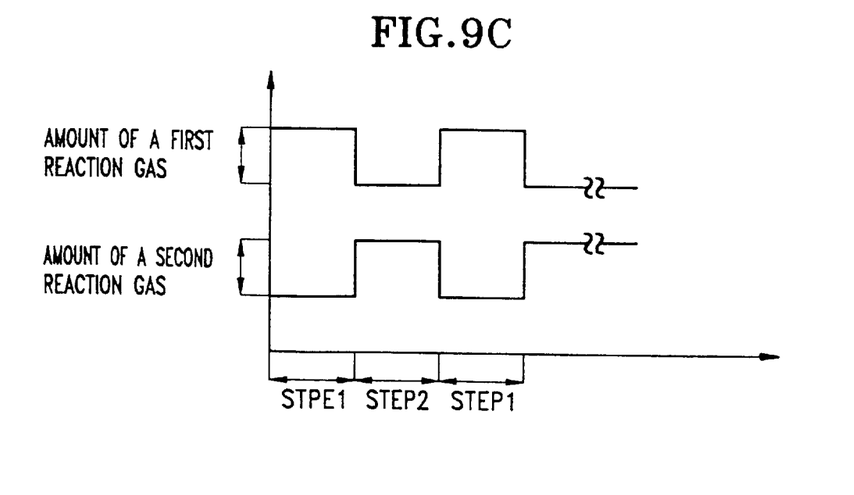

FIG. 9C shows the method of stacking RuO$_2$ and Ru alternately by using a conventional low pressure CVD method. The source of Ru and RuO$_2$ is an organic Ru material, preferably Ru$_3$(CO)$_{12}$ and Ru(C$_3$H$_5$)$_2$, respectively. Ru$_3$(CO)$_{12}$ and Ru(C$_3$H$_5$)$_2$ chemically react in a vacuum at 300° C. to form a Ru thin layer and under an oxygen atmosphere at 575° C. to form a RuO$_2$ thin film.

In the above CVD method, a first step of injecting a first reaction gas composed of the mixture of Ru(C$_3$H$_5$)$_2$ and O$_2$ into the chamber is executed to form an RuO$_2$ layer. Then, a second step of injecting a second reaction gas composed of only Ru$_3$(CO)$_{12}$ is executed to form an Ru layer. The first step and the second step are then repeatedly executed sufficient times to form the desired number of RuO$_2$/Ru stacked layers.

Second Preferred Embodiment

The second preferred embodiment is identical to the first preferred embodiment except that is uses Ta$_2$O$_5$ or a silicon nitride layer instead of a ferroelectric thin film as the dielectric layer of the capacitor. When using Ta$_2$O$_5$ as the dielectric and Ru and RuO$_2$ as the lower electrode, a low dielectric interlayer is not formed, making it possible to obtain a capacitor having a thinner equivalent oxide layer than would be available in the conventional method.

The conventional method uses a polycrystalline silicon as the lower electrode. This silicon has a larger oxide generation ability than Ta and so removes oxygen from the Ta$_2$O$_5$ layer to generate a silicon oxide layer between the polycrystalline silicon and Ta$_2$O$_5$. As a result of this, the thickness of the equivalent oxide layer of the capacitor increases. The second embodiment avoids this problem by using Ru and RuO$_2$ to form the lower electrode Third Preferred Embodiment The third preferred embodiment is identical to the first preferred embodiment, except that it uses a metal and a metal oxide or nitride instead of Ru and RuO$_2$. The metal oxide or nitride are adjusted in the amount of incorporated oxygen or nitrogen to have both a conductivity and an etching characteristic different from that of the metal. Selective etching is then executed based on the different etching characteristic to thereby increase the area of the lower electrode as in the first preferred embodiment. In this embodiment it is preferable that the metal be selected from the group consisting of Pt, Pd, Os, Al, Ti, and Ta, and that the metal oxide be tin oxide or osmium oxide.

Figure 10A:
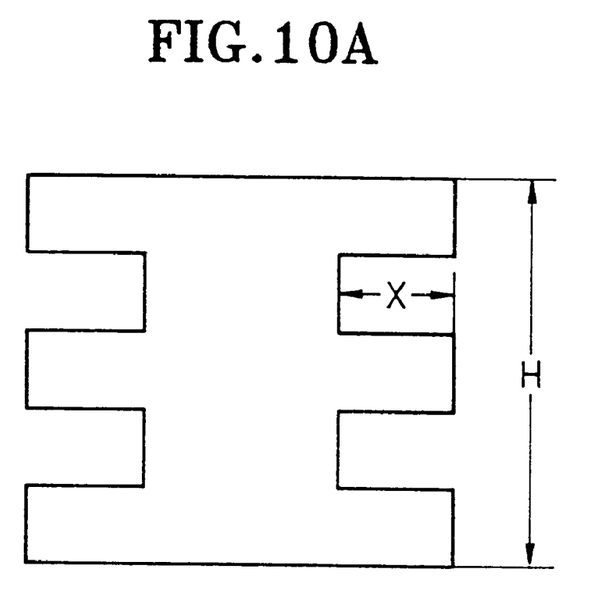
FIG. 10A is a cross-sectional view of the lower electrode of the capacitor according to a preferred embodiment of the present invention.
Figure 10B:
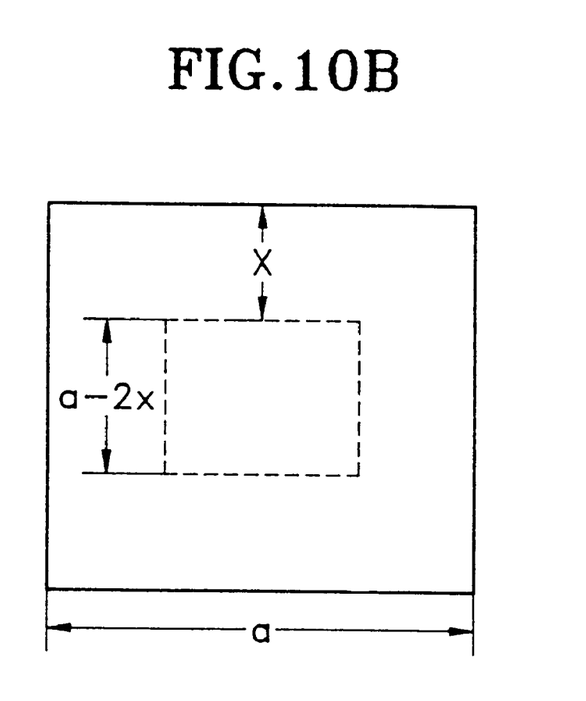
FIG. 10B is a plan view of the lower electrode of the capacitor according to a preferred embodiment of the present invention.

FIG. 10A is a cross-sectional view of the lower electrode of the capacitor according to the third preferred embodiment of the present invention. FIG. 10B is a plan view of the lower electrode of the capacitor according to the third preferred embodiment of the present invention.

FIG. 10A shows the height of the lower electrode fabricated according to the third preferred embodiment of the present invention and the depth of a metal layer resulting from the etching toward the inside of a storage node. The measurement "H" denotes the height of the lower electrode and the measurement "x" denotes the depth of the metal layer etched toward the inside of the lower electrode. As seen in FIG. 10B, the upper surface of the lower electrode is a square and the measurement "a" denotes the length of one side thereof.

The effective area ("S") of the lower electrode can be calculated by using the measurements of H, a, and x from FIGS. 10A and 10B as follows.

$$S = \text{cap area} + \text{side area} + \text{area increasing portion} = a^2 + 4aH + \{2ax + 2x(a-2x)\} \times 2n$$

where "a" denotes the length of one side when the upper surface of the electrode is a square, "x" denotes the depth of an etched portion of a second material layer, "H" denotes the height of the lower electrode, and "n" denotes the layer number of Ru layers.

When "a" is set to 0.7 mm and 0.4 mm in 256M DRAM and 1G DRAM, respectively and "H" is set to 0.3 mm, the increasing value of the effective area of the lower electrode of the capacitor is calculated as in the following table.

| No. of metal layers | 1G DRAM | | | 256M DRAM | | |
| --- | --- | --- | --- | --- | --- | --- |
| | x = 0.05 μm | x = 0.10 μm | x = 0.15 μm | x = 0.10 μm | x = 0.15 μm | x = 0.20 μm |
| none | 0.64 | 0.64 | 0.64 | 1.33 | 1.33 | 1.33 |
| one | 0.78 | 0.88 | 0.94 | 1.81 | 2.08 | 2.29 |
| two | 0.92 | 0.95 | 1.24 | 2.29 | 2.83 | 3.25 |
| three | 1.06 | 1.36 | 1.54 | 2.77 | 3.58 | 4.21 |

Note: The unit of incresing value of the effective area is μm$^2$.

As shown in the above table, if three metal layers are used by the method of the present invention as compared to none, the effective areas in the projection area of the capacitor of 1G DRAM and 256M DRAM can increase by up to 2.41 times and 3.17 times, respectively.

Fourth Preferred Embodiment

Figure 11:
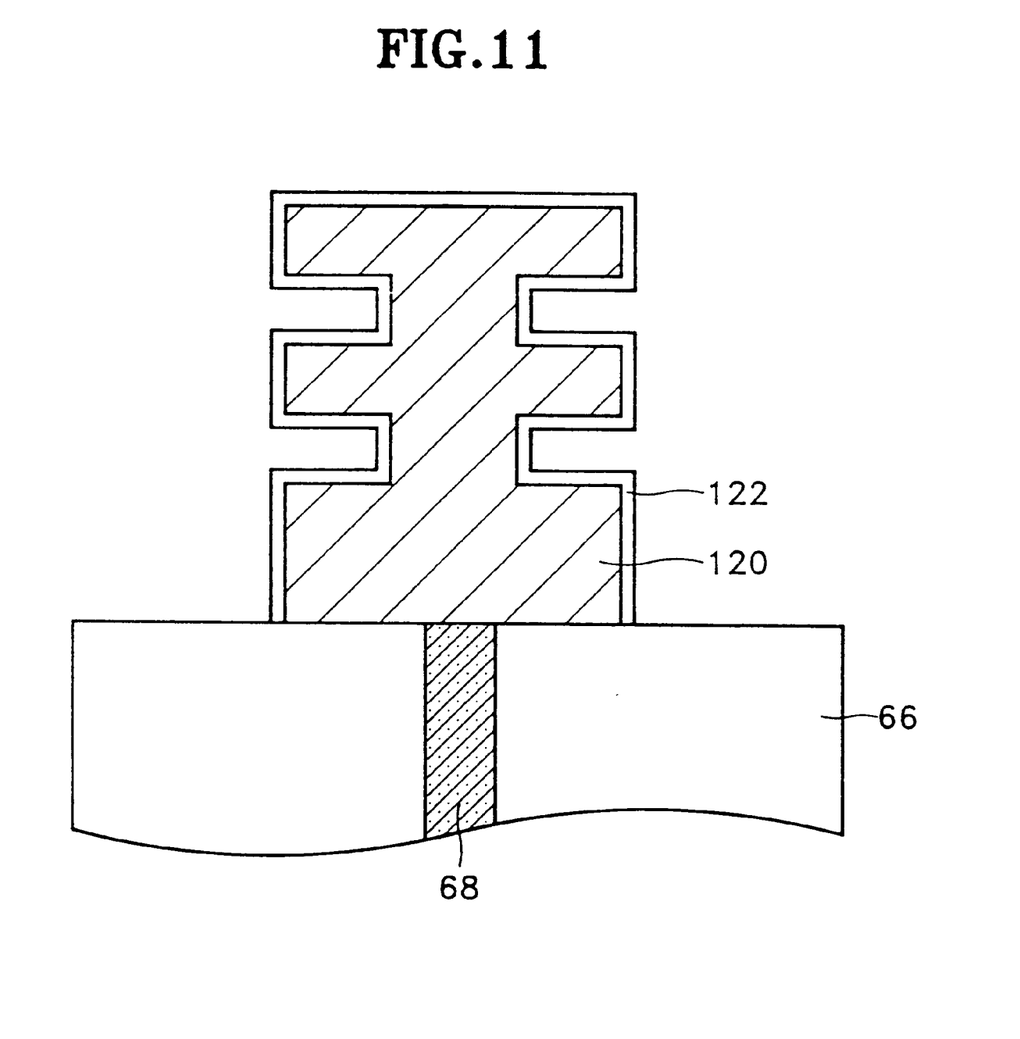
FIGS. 11 and 12 are cross-sectional views for illustrating a process for sequentially forming a dielectric layer and an upper electrode on the lower electrode of the capacitor according to a preferred embodiment of the present invention.
Figure 12:
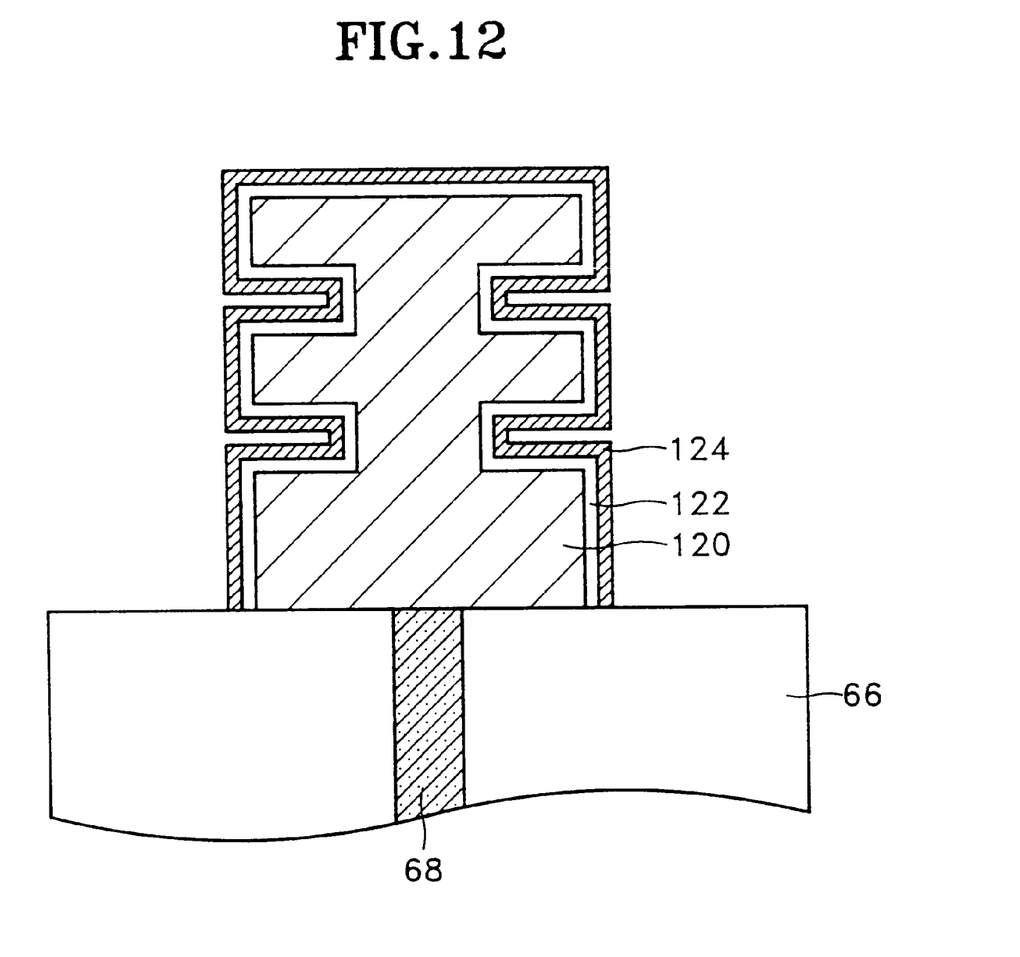

A fourth preferred embodiment is identical to the first preferred embodiment except for the addition of a process for forming the dielectric layer with tantalum pentoxide and a process for forming an upper electrode. FIGS. 11 and 12 are cross-sectional views illustrating processes for forming the tantalum pentoxide dielectric layer and the upper electrode on the lower electrode shown in FIG. 7.

FIG. 11 shows that a tantalum pentoxide layer 122 is formed on the surface of a lower electrode 120 formed by the process shown in FIGS. 2–7 and described in the accompanying text. The tantalum pentoxide layer 122 is preferably formed at a temperature of 400–500° C. and under a pressure of 400 mTorr while using Ta(C$_2$H$_5$)$_5$ and O$_2$ as raw materials.

Referring to FIG. 12, UV-ozone and dry oxygen heat treatments are first executed on the lower electrode 120 and the tantalum pentoxide layer 122. Then, a poly-silicon is deposited as the upper electrode 124. The above deposition method is preferably realized using SiH$_4$ and 3% PH$_4$ gases and using a low pressure CVD method at the temperature of approximately 570° C.

Figure 13A:
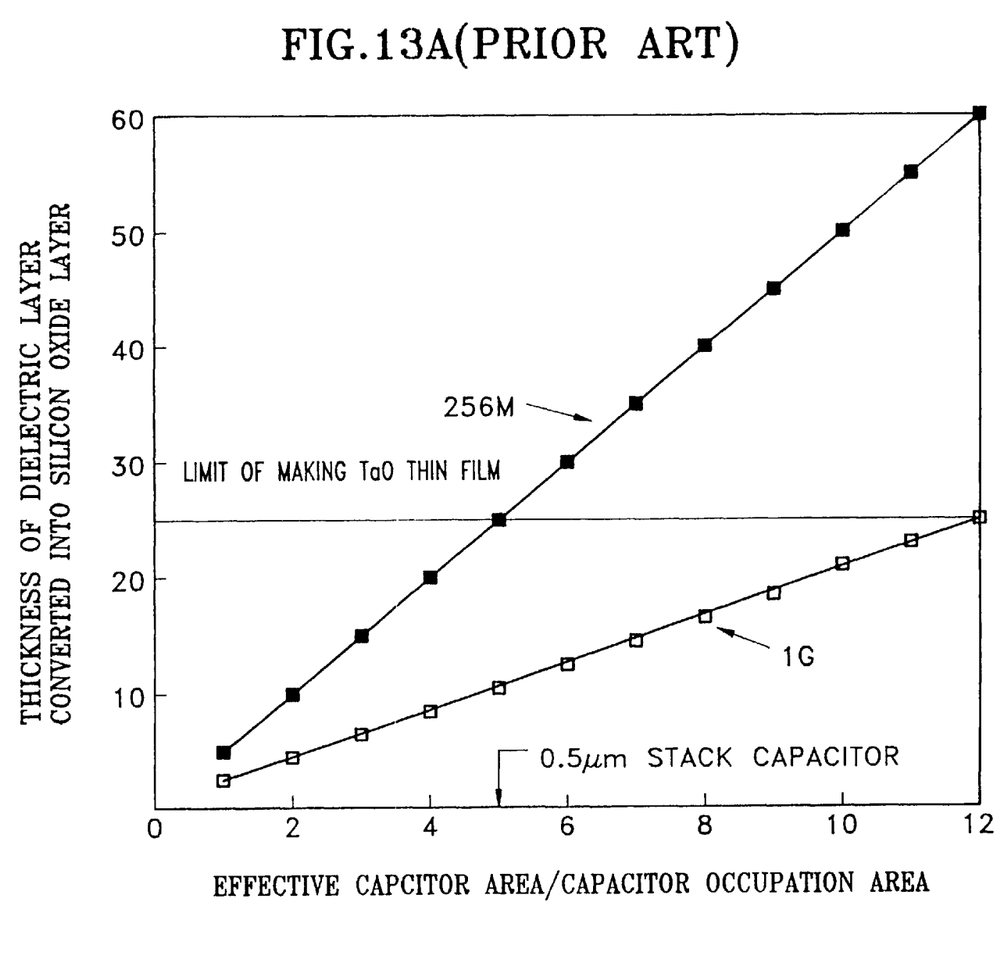
FIG. 13A is a graph showing the relationship between an effective electrode area of the capacitor and the thickness of the dielectric layer according to the conventional method.
Figure 13B:
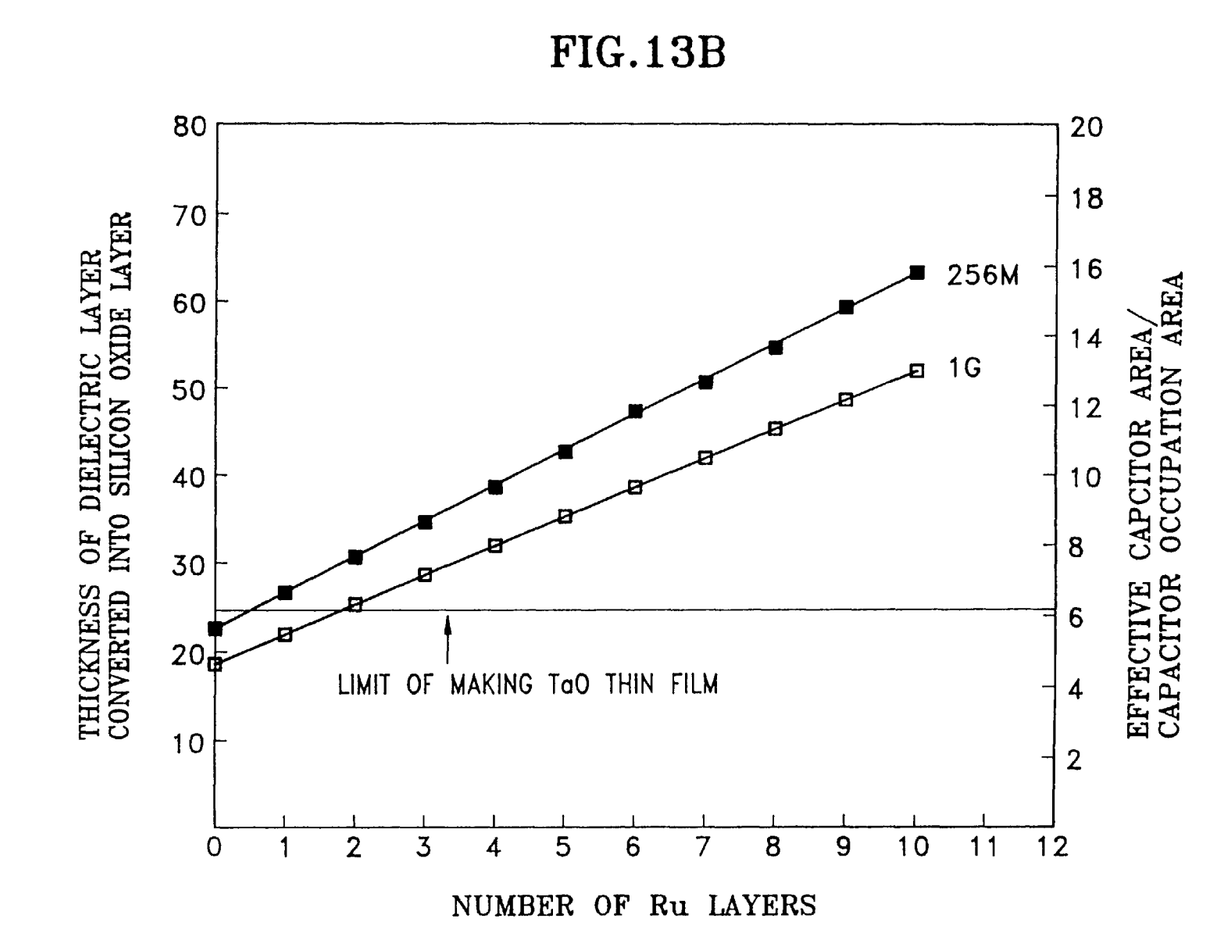
FIG. 13B is a graph showing the relationship between an effective electrode area of the capacitor and the thickness of the dielectric layer according to a preferred embodiment of the present invention.

FIGS. 13A and 13B are graphs showing the effects of the present invention according to the above examples. Referring to FIG. 13A, a horizontal axis denotes the effective area of the capacitor and a vertical axis denotes the thickness of the necessary dielectric layer converted into a silicon oxide layer. It is assumed that the projection areas of the capacitors of 256M DRAM and 1G DRAM are set to 0.4 mm×0.9 mm and 0.34 mm×0.5 mm, respectively and the capacitance needed to drive DRAM is set to 25fF per cell. Also, it is assumed that the depth etched in the direction towards the center by the selective etching is 0.15 mm.

In the case of a stack type capacitor having a height of 0.5 mm, the thickness of the tantalum pentoxide layer is preferably no more than 23 Å and 18 Å, respectively, for the 256M DRAM and 1G DRAM. This will secure the capacitance needed by these devices since the effective area of the stack capacitor is about 5 times the occupation area of the stack capacitor. The above thickness is close to or beyond the thickness limit in making a thin film of the tantalum pentoxide. Accordingly, in order to obtain the effective capacitance needed in DRAM within the limit of making the thin film, the ratio of the effective capacitor area to the occupation area of the capacitor is preferably no less than 5 in 256M DRAM and no less than 11 in 1G DRAM.

FIG. 13B shows the relation between the thickness of the dielectric layer converted into a silicon oxide layer needed to obtain 25fF in the 256 DRAM and the effective capacitance area/capacitor occupation area according to the number of Ru layers of the lower electrode of RuO$_2$/Ru stacked layer. This graph applies to a device formed by applying tantalum pentoxide to a fin-shaped lower electrode by the method of the present invention. It is assumed that the thickness of the lower electrode is 0.5 mm. If the number of the Ru layers is not less than 2 in the 256M DRAM, it is possible to secure the capacitance to more than 25fF by using the tantalum pentoxide layer having the thickness converted into a silicon oxide layer of 32 Å.

Fifth Preferred Embodiment

A fifth preferred embodiment is identical to the first preferred embodiment except it uses dielectric materials selected from PLZT ((Pb,La)(Zr,Ti)O$_3$), Bi$_3$Ti$_4$O$_{12}$, lead zirconate, STO (SrTiO$_3$), silicon oxide, ONO (oxide-nitride-oxide), titanium silicate, titanium oxide, lead titanate, and SrBi$_2$Ta$_2$O$_9$.

The electrode comprised of a conductive oxide and a conductive substance of the present invention is stable under an oxygen atmosphere. Accordingly, since the capacitor electrode of the present invention maintains conductivity under the oxygen atmosphere, it is possible to prevent the generation of problems caused by oxidation occurring in subsequent processes such as a cleaning cycle, a deionized water rinsing, and exposure to air. Accordingly, this improves the electrical contact of the capacitor electrode without extra processes such as etching the oxide or isolating the wafer from oxygen.

Using tantalum pentoxide in the capacitor of the present invention makes it possible to prevent generation of an oxide layer having a low dielectric constant between the lower electrode and the tantalum pentoxide. This is possible since the lower electrode is an oxide electrode composed of RuO$_2$. Also, the lower electrode has a fin-shaped structure, increasing the effective capacitor area and increasing the usable thickness of the tantalum pentoxide layer converted into the silicon oxide layer. Although the lower electrode has a complicated fin-shaped structure, the poly-silicon having a superior step coverage is used as the upper electrode to thereby form a uniform upper electrode over the whole surface of the storage node.

The present invention is explained above by way of examples, but the present invention can be improved and altered by those of ordinary skill in the art. For example, the electrode composed of ruthenium and ruthenium oxide can be fabricated in other shapes such as a trench type, a double box type, a parallel flat plate type, a crown type, or a nested type. A nonvolatile memory cell as well as a DRAM memory cell can be formed by the electrode according to the present invention. The ruthenium and the ruthenium oxide may constitute only the portion of the capacitor electrode. The electrode may be composed of aluminum or poly-silicon the surface of which may be covered with ruthenium oxide to prevent the oxidation of the electrode. A material containing ruthenium besides the ruthenium material explicitly mentioned in the present invention can be used in fabricating the capacitor according to the present invention. Calcium-ruthenate, strontium ruthenate, barium ruthenate, thallium ruthenate, bismuth ruthenate, and lead ruthenate can be used as the electrode material of the capacitor according to the present invention. A plurality of materials can be used as the capacitor insulating layer between the electrodes. The diffusion barrier layer mentioned above according to the preferred embodiments of the present invention may be eliminated.

Accordingly, the present invention is not limited to the specific examples described above. It should be understood that those of ordinary skill in the art will contemplate many variations and modifications to the foregoing examples that fall within the scope of the present invention as set forth in the attached claims.

What is claimed is:

1. A capacitor comprising:
   a first electrode formed as a fin-shaped structure including one or more first material layers alternately stacked over one or more second material layers;
   a second electrode; and
   a dielectric material formed between the first electrode and the second electrode,
   wherein the one or more first material layers comprise a conductive oxide, the one or more second material layers comprise a conductive substance, and the one or more second material layers are etched to have a width shorter than that of the one or more first material layers.

2. A capacitor according to claim 1, wherein exposed surfaces of the one or more second material layers are covered with an oxide layer.

3. A capacitor according to claim 2, wherein the thickness of the oxide layer is between 50–200 Å.

4. A capacitor according to claim 1, wherein the one or more first material layers of the first electrode are formed of a material selected from the group consisting of ruthenium oxide, indium tin oxide, osmium oxide, and iridium oxide.

5. A capacitor according to claim 1, wherein the one or more second material layers of the first electrode are formed of a material selected from the group consisting of Pt, Pd, Ir, Ru, Os, Al, Ti, and Ta.

6. A capacitor according to claim 1, wherein the dielectric material is selected from the group consisting of PZT(Pb(Zr,Ti)O$_3$), PLZT((Pb,La)(Zr,Ti)O$_3$), Bi$_3$Ti$_4$O$_{12}$, lead zirconate, BST(BaSrTiO$_3$), STO(SrTiO$_3$), tantalum pentoxide, silicon oxide, ONO (oxide-nitride-oxide), titanium silicate, silicon nitride, titanium oxide, lead titanate, and SrBi$_2$Ta$_2$O$_9$.

7. A capacitor according to claim 1, wherein the second electrode comprises a material selected from the group consisting of Ru, Pt, Ti, and Ir.

8. A capacitor according to claim 1, wherein the second electrode comprises poly-silicon and the dielectric material comprises tantalum pentoxide.

9. A capacitor according to claim 1, wherein the capacitor is connected to an electrode of a transistor to thereby constitute a DRAM cell or a nonvolatile storage cell.

10. A capacitor according to claim 1, wherein the capacitor further comprises:

a conductive plug for electrically connecting the first electrode to a source region on a semiconductor substrate; and a diffusion barrier formed between the first electrode and the conductive plug.

* * * * *